United States Patent [19]

Dortu et al.

[11] Patent Number: 5,050,211
[45] Date of Patent: Sep. 17, 1991

[54] SAFETY INTERLOCK

[75] Inventors: Giovanni Dortu, Cormeilles en Parisis; Francois Buhagiar, Drancy, both of France

[73] Assignee: Telic Alcatel, Paris, France

[21] Appl. No.: 421,433

[22] Filed: Oct. 13, 1989

[30] Foreign Application Priority Data

Oct. 13, 1988 [FR] France .................................. 88 13478

[51] Int. Cl.⁵ .................................................. H04M 1/00
[52] U.S. Cl. ...................................... 379/438; 439/911
[58] Field of Search ............... 379/419, 428, 437, 438, 379/445, 447, 451, 457; 439/92, 93, 101, 106, 135, 137, 138, 139, 140, 345, 367, 911, 922, 923, 928

[56] References Cited

U.S. PATENT DOCUMENTS

| | | | |
|---|---|---|---|
| 4,091,246 | 5/1978 | Donotrio et al. | 439/911 |
| 4,582,381 | 4/1986 | Bisczat et al. | 439/911 |
| 4,647,726 | 3/1987 | Blum | 379/438 |

FOREIGN PATENT DOCUMENTS

| | | |
|---|---|---|
| 0176676 | 4/1986 | European Pat. Off. . |
| 1096974 | 1/1961 | Fed. Rep. of Germany . |
| 7529370 | 1/1976 | Fed. Rep. of Germany . |
| 1260288 | 1/1972 | United Kingdom . |

*Primary Examiner*—Jin F. Ng
*Assistant Examiner*—William Cumming
*Attorney, Agent, or Firm*—Sughrue, Mion, Zinn, Macpeak & Seas

[57] ABSTRACT

The safety interlock for a cover of a housing in a telephone apparatus provides electrical safety for the user by requiring the apparatus to be disconnected from a telephone line before the cover of the housing can be opened. The apparatus is connected to the telephone line by means of a two-part pluggable connector, with one of the parts being a receptacle fixed in the case of the apparatus. The safety interlock comprises a flap (8) which slides inside the case (1, 2) of the apparatus over the opening (5) giving access to the telephone line connector receptacle, with the flap sliding between a closed position in which it disengages the opening (5) while holding the cover (8) of the housing closed, and an open position in which it obstructs the opening (5) while allowing the cover (3) of the housing to be opened.

5 Claims, 3 Drawing Sheets

SAFETY INTERLOCK

FIELD OF THE INVENTION

The present invention relates to the electrical safety of telephone apparatuses.

Safety standards require that all parts of telephone apparatus which are accessible to the hand without using a tool shall be incapable of being raised to an electric potential which is dangerous for the user. In simple telephone sets, this condition is satisfied by enclosing metal portions that could be dangerous inside insulating housings that cannot be opened without using a tool, e.g. by virtue of locking studs or screws that require a screwdriver to unlock them. In some telephone apparatuses having housings closed by covers, e.g. housings for receiving batteries or magnetic tape cassettes in a telephone answering machine, the covers are locked in place by latches which do not include operating heads, and which can be moved solely by means of a screwdriver or the tip of a tool. However, this is inconvenient for the user who does not necessarily have a tool available when a battery or a magnetic tape cassette needs changing.

The object of the present invention is to ensure electrical safety of a telephone apparatus including a covered housing for receiving a removable component, while still ensuring that the apparatus is convenient to handle, with this being achieved by obliging the user to disconnect the telephone apparatus prior to opening the cover and while the cover is opened.

SUMMARY OF THE INVENTION

The present invention provides a safety interlock for a cover of a housing in a telephone apparatus case, the telephone apparatus being connected to a telephone line via a connector having two pluggable portions constituted by a receptacle fixed to the case and a plug fixed to the end of a connection cord. The interlock comprises access controlling means for preventing the plug gaining access to the receptacle when the cover is open, for requiring the connection cord to be disconnected prior to opening the cover, and for allowing the plug to gain access to the receptacle in order to be plugged thereto for providing connection to the cord when the cover is closed.

Advantageously, the access controlling means are constituted by a flap which slides inside the case of the telephone apparatus in front of the receptacle of the connector, between a closed position in which it leaves open access to the receptacle for the plug of the connector while holding the cover closed, and an open position in which it obstructs access to the receptacle for the connector plug while allowing the cover to be opened. The flap may be constituted by a part which is separate from the cover or which is integral therewith.

BRIEF DESCRIPTION OF THE DRAWINGS

Other characteristics and advantages of the present invention appear from the following description of two embodiments, given by way of example. The description refers to the drawings, in which.

DESCRIPTION OF THE PREFERRED EMBODIMENTS

Figure 1:
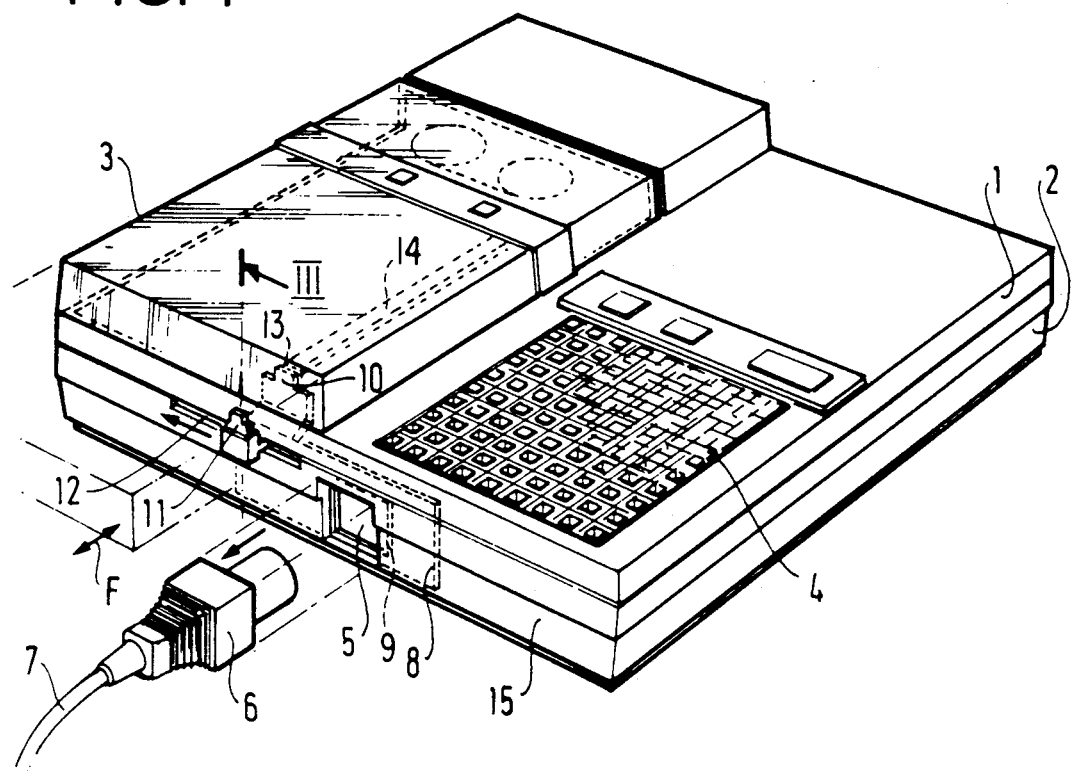
FIG. 1 is a perspective view of the case of a telephone answering machine having a sliding cover for a magnetic tape cassette housing, and a telephone line connection connector which is unpluggable in the sliding direction of the cover.
Figure 2:
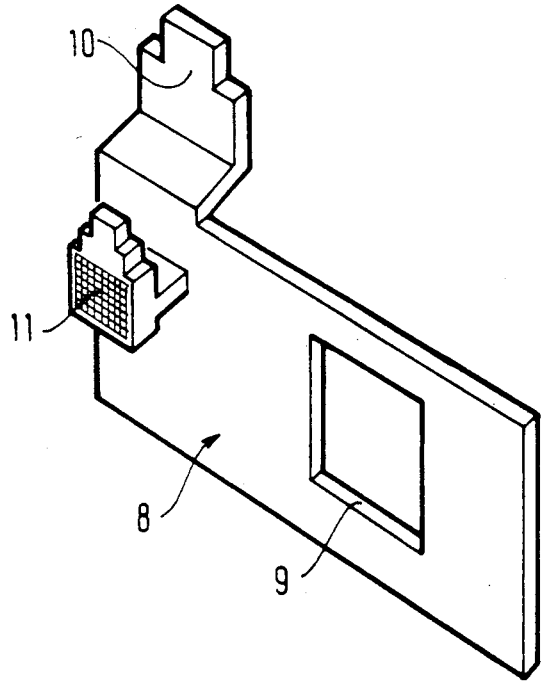
FIG. 2 is a perspective view of a shutter flap as used inside the case of the telephone answering machine shown in FIG. 1 in order to prevent access to the receptacle of the line connection connector while the cover of the magnetic tape cassette housing is open.

The telephone answering machine case shown in FIG. 1 is flat and rectangular in shape. It comprises two half-shells 1 and 2 of molded plastic material, and on top and to the right it has a magnetic tape cassette recording and playback mechanism covered by an upstanding cover 3, while on its lefthand side it has a grille 4 hiding a loudspeaker. An opening 5 in the side wall of the case gives access to the receptacle of a pluggable connector whose plug 6 is fixed to the end of a cord 7 for connection to a telephone line.

The cover 3 is shown in its closed position and is slidable along an axis F like a drawer by virtue of a system of slideways (not shown). It is held prisoner on the case and at the end of an opening stroke it stops sliding in an abutment position as soon as the magnetic tape cassettes becomes accessible.

The opening movement of the cover 3 is controlled by means of a flap 8 visible in dashed lines behind the side wall 15 which is shown as being at the front of the case in FIG. 1 and which actually corresponds to the rear face of the answering machine as seen by the user. The flap 8 is situated behind the side wall 15 of the case over the opening 5 giving access to the telephone line connector receptacle, and it is capable of sliding horizontally between a closed position and an open position. The flap has a window 9 of the same size as the opening 5 and it includes a cover-locking offset side finger 10 and an actuating knob 11 fixed to a flank thereof and projecting beyond the side wall 15 of the case through a horizontal slideway slot 12.

In the closed position, the flap 8 has its window 9 overlying the opening 5, thereby allowing access to the connector receptacle for the connector plug so as to allow the answering machine to be connected to a telephone line, while its finger 10 comes beneath the cover 3 and engages an abutment 13 in order to keep the cover 3 closed.

In the open position, the flap 8 takes its window 9 away from the opening 5, thereby obstructing it so as to prevent access to the connector base by the plug 6, thereby requiring the answering machine to be disconnected from the telephone line, while its finger 10 moves sideways away from the abutment 13, thereby allowing the cover 3 to be opened.

The abutment 13 is formed on the inside wall of the cover 3 by the end of a rib 14 which runs parallel to the sliding direction of the cover 3 and which rubs against the side of the finger 10 on the flap 8 in order to prevent the flap 8 from returning to the closed position so long as the cover 3 is open, thereby ensuring that the answering machine cannot be connected to a telephone line unless the cover 3 is closed.

Figure 3:
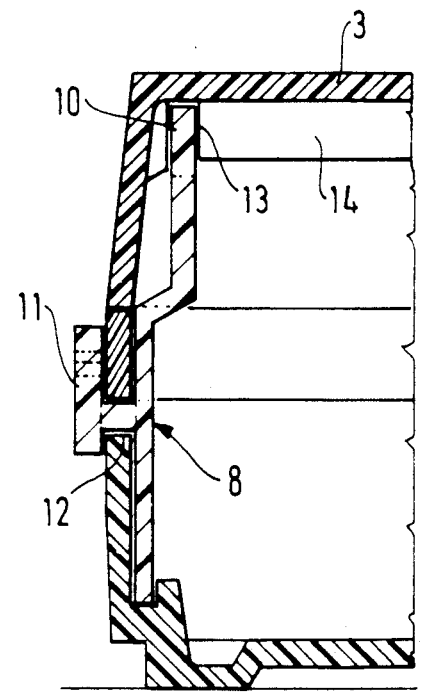
FIG. 3 is a fragmentary vertical section view on line III of FIG. 1.

The section of FIG. 3 shows the flap 8 and the cover 3 in the closed position and it shows, in particular, the position of the finger 10 behind its abutment 13 as constituted by the end of the rib 14 projecting from the inside face of the cover 3.

Figure 4:
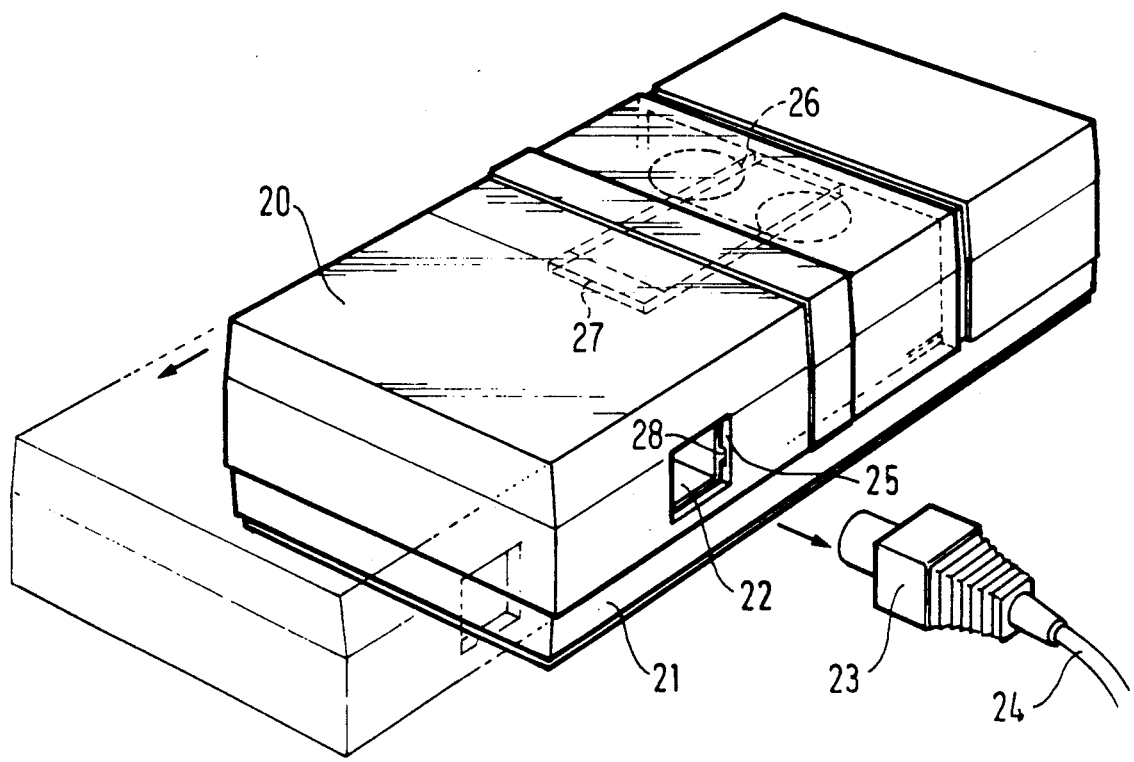
FIGS. 4 and 5 are perspective views of the case of a different telephone answering machine having a sliding cover for its magnetic tape cassette housing and having a telephone line connection connector which is unpluggable in a direction perpendicular to the sliding access of the cover, with one of the figures showing the closed position and the other the open position.
Figure 5:
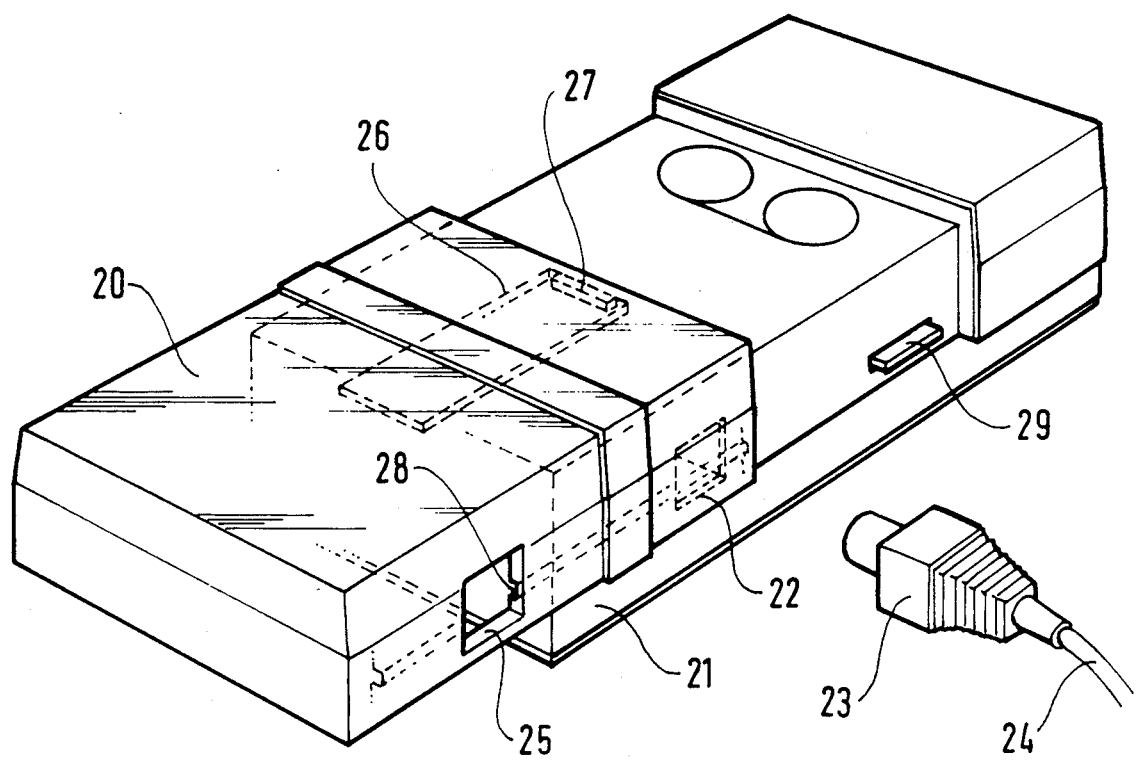

FIG. 4 shows another embodiment of a telephone answering machine in which the flap obstructing the telephone line connector constitutes a portion of one of the flanks of the cover which slides over the housing of the magnetic tape cassette record and playback mechanism.

The sliding cover 20 extends over a portion of the top surface of the case 21 from one side to the other, and has flanks which cover respective portions of the front and side walls of the case 21 to which the cover is attached, e.g. by means of two lateral grooves 28 formed longitudinally in each of the flanks of the cover in order to overlie retaining studs 29 disposed on either side of the case. As before, the cover 20 slides towards the front of the case 21 or towards the rear, like a drawer, and it stops at the end of its opening stroke in an abutment position where the magnetic tape cassette is made accessible. The stroke of the cover relative to the case is limited in this case by co-operation between a projecting abutment 27 situated on the case so as to slide in a complementary longitudinal groove 26 formed in the cover and having closed ends. The left side flank of the sliding cover 20 completely covers an opening 22 in the case 21 giving access to the receptacle of an unpluggable connector whose plug 23 is fixed to the end of a cord 24 for connection to a telephone line, and said flank includes a window 25 having the same size as the opening 22. When the cover 20 is in its closed position, the window 25 overlies the opening 22 and allows the answering machine to be connected to a telephone line. As soon as the sliding cover 20 begins to open, the window moves away from the opening 22 in the case, which opening is progressively closed by the left side flank of the cover 20 in order to prevent access to the connector receptacle. In order to continue the opening motion of the sliding cover 20, the plug 23 must be withdrawn from the receptacle, thereby disconnecting the telephone line, which can only be reconnected after the cover 20 has been closed.

Without going beyond the scope of the invention, certain dispositions can be changed and certain means can be replaced by equivalent means. For example, it is clear that when the telephone apparatus also needs connecting to mains, it should be connected by means of an unpluggable connector whose access is blocked when the cover is open either by means of the cover itself or else by means of an auxiliary flap as described above with reference to the telephone line connector.

We claim:

1. A safety interlock for a cover (3) of a housing in a telephone apparatus case (1, 2), the telephone apparatus being connected to a telephone line via a connector having two pluggable portions constituted by a receptacle fixed to the case and a plug (6) fixed to the end of a connection cord (7), the interlock being characterized in that it comprises access controlling means for preventing the plug (6) gaining access to the receptacle when the cover is open, for requiring the connection cord (7) to be disconnected prior to opening the cover (3), and for allowing the plug (3) to gain access to the receptacle in order to be plugged thereto for providing connection to the cord (7) when the cover (3) is closed.

2. An interlock according to claim 1, characterized in that said access controlling means comprise a flap (8) sliding inside the case (1, 2) in front of the connector receptacle, between a closed position which coincides with the closed position of the cover (3) in which access for the plug (6) to the connector receptacle is left unobstructed in order to enable the plug (6) of the connection cord (7) to be plugged thereto, and an open position which coincides with the cover (3) being open and in which it obstructs access of the plug (6) to the connector receptacle, thereby obliging the connection cord (7) to be disconnected from the case (1, 2).

3. An interlock according to claim 2, for a sliding cover, the interlock being characterized in that said flap (8) is provided with a finger (10) which co-operates, in the closed position of the flap (8) and of the cover (3) with an abutment (13) on the inside wall of the cover (3) in order to prevent the cover (3) from being opened, and in the open position of the flap (8) with a rib (14) projecting from the inside wall of the cover (3) and extending the abutment (13) parallel to the sliding direction of said cover (3) in order to prevent the flap (8) from returning to its closed position so long as the cover (3) is not closed.

4. An interlock according to claim 3, characterized in that said flap (8) is provided on one of its flanks with an actuator knob (11) projecting outside the case via the slot (12) of a slideway running parallel to the sliding access of the flap (8).

5. An interlock according to claim 2, characterized in that said flap (8) constitutes a portion of the wall of the cover (20).

* * * * *